United States Patent
Yang et al.

(10) Patent No.: US 10,754,212 B2
(45) Date of Patent: Aug. 25, 2020

(54) LIQUID CRYSTAL DISPLAY

(71) Applicant: Apple Inc., Cupertino, CA (US)

(72) Inventors: Byung Duk Yang, Cupertino, CA (US); Hao-Lin Chiu, Campbell, CA (US); Kwang Soon Park, San Ramon, CA (US); Kyung Wook Kim, Saratoga, CA (US); Sai-Chang Liu, Sunnyvale, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 81 days.

(21) Appl. No.: 16/041,667

(22) Filed: Jul. 20, 2018

(65) Prior Publication Data

US 2019/0086720 A1    Mar. 21, 2019

Related U.S. Application Data

(60) Provisional application No. 62/561,626, filed on Sep. 21, 2017.

(51) Int. Cl.
| | |
|---|---|
| *G02F 1/1335* | (2006.01) |
| *G02F 1/1362* | (2006.01) |
| *G02F 1/1368* | (2006.01) |
| G02F 1/1333 | (2006.01) |

(52) U.S. Cl.
CPC ...... *G02F 1/136209* (2013.01); *G02F 1/1368* (2013.01); *G02F 1/136227* (2013.01); *G02F 2001/13685* (2013.01); *G02F 2001/133357* (2013.01); *G02F 2001/136222* (2013.01)

(58) Field of Classification Search
CPC ................................. G02F 1/136209
See application file for complete search history.

(56) References Cited

U.S. PATENT DOCUMENTS

| | | | | |
|---|---|---|---|---|
| 5,926,240 A | * | 7/1999 | Hirota | G02F 1/133553 349/114 |
| 5,994,721 A | | 11/1999 | Zhong et al. | |
| 6,162,654 A | * | 12/2000 | Kawabe | G02F 1/133512 438/30 |
| 8,629,967 B2 | | 1/2014 | Choi et al. | |

(Continued)

FOREIGN PATENT DOCUMENTS

| | | | | |
|---|---|---|---|---|
| CN | 106098703 | * | 11/2016 | ....... G02F 1/133345 |
| CN | 106098703 A | | 11/2016 | |

*Primary Examiner* — Sang V Nguyen
(74) *Attorney, Agent, or Firm* — Treyz Law Group, P.C.; G. Victor Treyz; David K. Cole

(57) ABSTRACT

A display may have pixels configured to display images. The pixels may be formed from thin-film transistor circuitry on a substrate. Color filter elements formed from colored polymer such as colored photoimageable polymer may be formed on the substrate. A black matrix formed from black photoimageable polymer may have an array of openings. The colored polymer may have first portions that overlap the black matrix and second portions in the openings that form the color filter elements. In some portions of the pixels, the thin-film transistor circuitry may be interposed between the first portions of the colored polymer and the black matrix. In other portions of the pixels, data lines may be formed that are overlapped by the black matrix and that are interposed between the first portions of the colored polymer and the black matrix.

20 Claims, 9 Drawing Sheets

(56) References Cited

U.S. PATENT DOCUMENTS

| | | | |
|---|---|---|---|
| 9,395,589 B2* | 7/2016 | Qi | G02F 1/133512 |
| 9,664,948 B2 | 5/2017 | Arai et al. | |
| 2014/0147966 A1* | 5/2014 | Nakagawa | G02F 1/136227 |
| | | | 438/104 |
| 2015/0185556 A1* | 7/2015 | Arai | G02F 1/1368 |
| | | | 349/43 |
| 2015/0219972 A1* | 8/2015 | Yang | G02F 1/136209 |
| | | | 349/43 |
| 2015/0323841 A1* | 11/2015 | Matsushima | G02F 1/134336 |
| | | | 349/33 |
| 2015/0331292 A1* | 11/2015 | Yang | G02F 1/133512 |
| | | | 349/40 |
| 2015/0372011 A1 | 12/2015 | Zhang et al. | |
| 2016/0131937 A1* | 5/2016 | Yang | G03F 7/0007 |
| | | | 349/42 |
| 2016/0170129 A1* | 6/2016 | Xu | G02F 1/133553 |
| | | | 349/42 |
| 2016/0342047 A1 | 11/2016 | Song | |
| 2017/0293174 A1* | 10/2017 | Tai | G02F 1/1368 |
| 2018/0004052 A1* | 1/2018 | Tang | G02F 1/133345 |
| 2018/0217465 A1* | 8/2018 | Nagata | G02F 1/13338 |
| 2018/0307070 A1* | 10/2018 | Fujisawa | C09K 19/38 |

* cited by examiner

LIQUID CRYSTAL DISPLAY

This application claims the benefit of provisional patent application No. 62/561,626, filed Sep. 21, 2017, which is hereby incorporated by reference herein in its entirety.

BACKGROUND

This relates generally to electronic devices, and, more particularly, to electronic devices with displays.

Electronic devices such as cellular telephones, computers, and other electronic devices often contain displays. Liquid crystal displays have a layer of liquid crystal material interposed between upper and lower substrates. Pixels may be formed from thin-film transistor circuitry. Color filter elements are used to provide the display with the ability to display color images. In some configurations, the color filter elements and thin-film transistor circuitry are provided on the inner surface of the upper substrate.

SUMMARY

A display may have pixels configured to display images. The pixels may be formed from thin-film transistor circuitry on a substrate. Color filter elements formed from colored polymer such as colored photoimageable polymer may be formed on the substrate. A black matrix formed from black photoimageable polymer may have an array of openings. The colored polymer may have first portions that overlap the black matrix and second portions in the openings that form the color filter elements.

In some portions of the display, the thin-film transistor circuitry may be interposed between the first portions of the colored polymer and the black matrix. In other portions of the display, data lines may be formed that overlap with the black matrix and that are interposed between the first portions of the colored polymer and the black matrix.

The substrate may be an upper substrate in a liquid crystal display. A layer of liquid crystal material may be interposed between the upper substrate and a lower substrate. Polarizers may be formed above and below the upper and lower substrates. A backlight adjacent to the lower substrate layer may be used to supply backlight illumination for the display.

DETAILED DESCRIPTION

Figure 1:
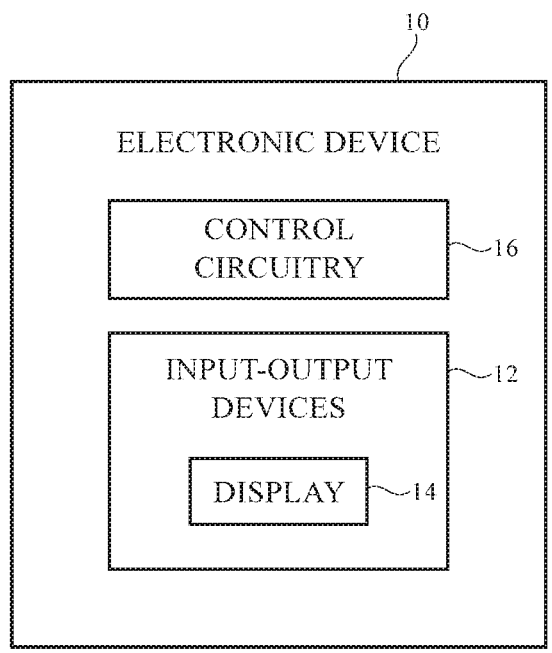
FIG. 1 is a schematic diagram of an illustrative electronic device having a display in accordance with an embodiment.

An illustrative electronic device of the type that may be provided with a display is shown in FIG. 1. Electronic device 10 of FIG. 1 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Display 14 may have a rectangular shape (i.e., display 14 may have a rectangular footprint and a rectangular peripheral edge that runs around the rectangular footprint) or may have other suitable shapes. Display 14 may be planar or may have a curved profile. Display 14 may be a liquid crystal display or other suitable type of display.

Figure 2:
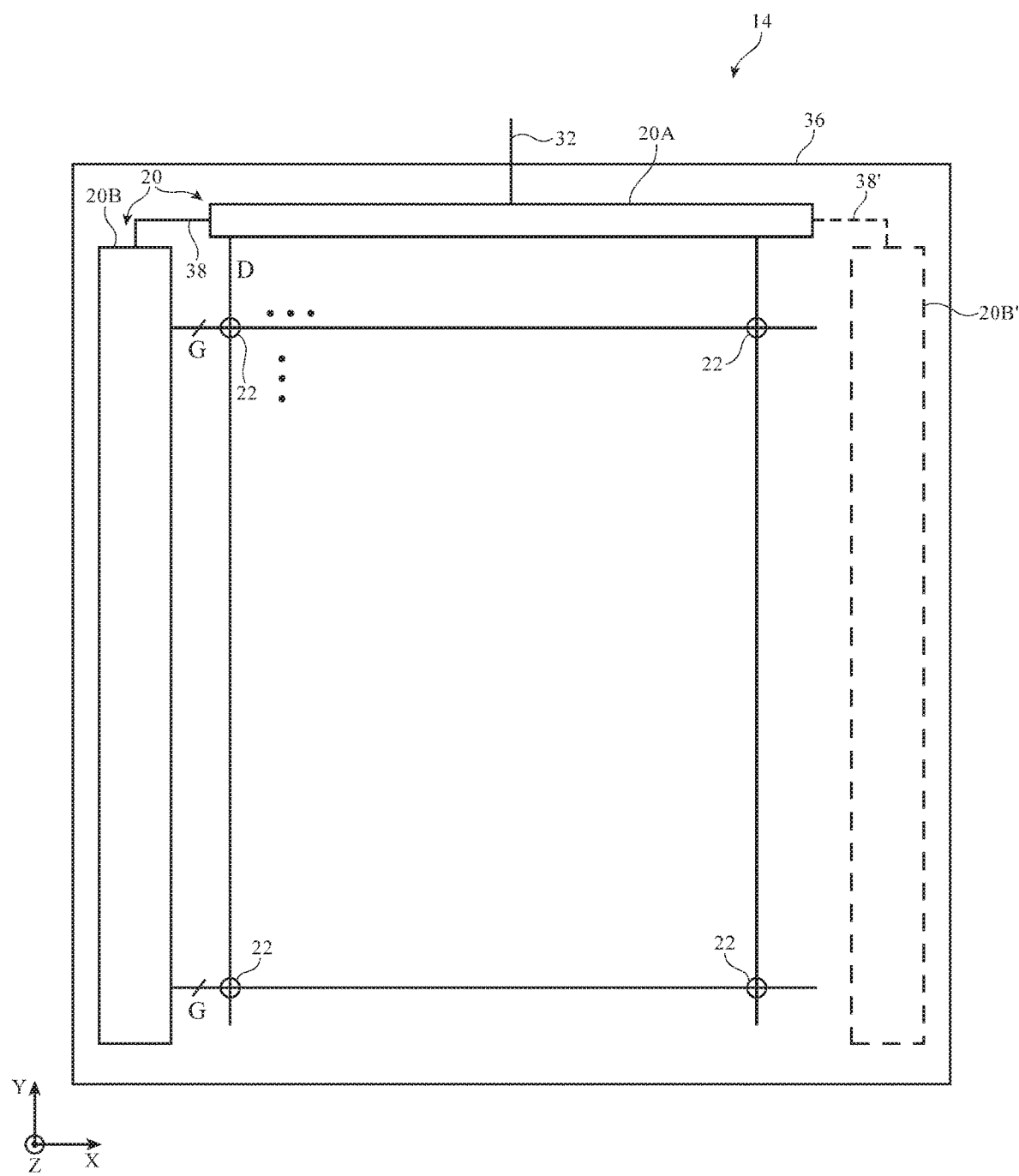
FIG. 2 is a top view of an illustrative display in an electronic device in accordance with an embodiment.

A top view of a portion of display 14 is shown in FIG. 2. As shown in FIG. 2, display 14 may have an array of pixels 22 formed from substrates such as substrate 36. Substrates such as substrate 36 may be formed from glass, metal, plastic, ceramic, or other substrate materials. Pixels 22 may receive data signals over signal paths such as data lines D and may receive one or more control signals over control signal paths such as gate lines G (sometimes referred to as control lines, gate signal paths, etc.). There may be any suitable number of rows and columns of pixels 22 in display 14 (e.g., tens or more, hundreds or more, or thousands or more). Pixels 22 may have different colors (e.g., red, green, and blue) to provide display 14 with the ability to display color images.

Pixels 22 contain pixel circuits. Each pixel circuit 22 may include electrode fingers for applying an electric field to a corresponding pixel-sized portion of a liquid crystal layer, a storage capacitor for storing data signals between frames, and an associated thin-film transistor for loading the storage capacitor with data from a data line in response to gate signals applied to the gate of the thin-film transistor with a gate line.

Display driver circuitry 20 may be used to control the operation of pixels 22. Display driver circuitry 20 may be formed from integrated circuits, thin-film transistor circuits, or other suitable circuitry. Thin-film transistor circuitry for display driver circuitry 20 and pixels 22 may be formed from polysilicon thin-film transistors, semiconducting-oxide thin-film transistors such as indium gallium zinc oxide transistors, or thin-film transistors formed from other semiconductors.

Display driver circuitry 20 may include display driver circuits such as display driver circuit 20A and gate driver circuitry 20B. Display driver circuit 20A may be formed from one or more display driver integrated circuits and/or thin-film transistor circuitry (e.g., timing controller integrated circuits). Gate driver circuitry 20B may be formed from gate driver integrated circuits or may be thin-film "gate-on-array" circuitry.

As shown in FIG. 2, display driver circuit 20A may contain communications circuitry for communicating with system control circuitry such as control circuitry 16 of FIG. 1 over path 32. Path 32 may be formed from traces on a flexible printed circuit or other conductive lines. During operation, the control circuitry (e.g., control circuitry 16 of FIG. 1) may supply circuit 20A with information on images to be displayed on display 14. To display images on display pixels 22, display driver circuitry 20A may supply image data to data lines D while issuing control signals to supporting display driver circuitry such as gate driver circuitry 20B over path 38.

Figure 3:
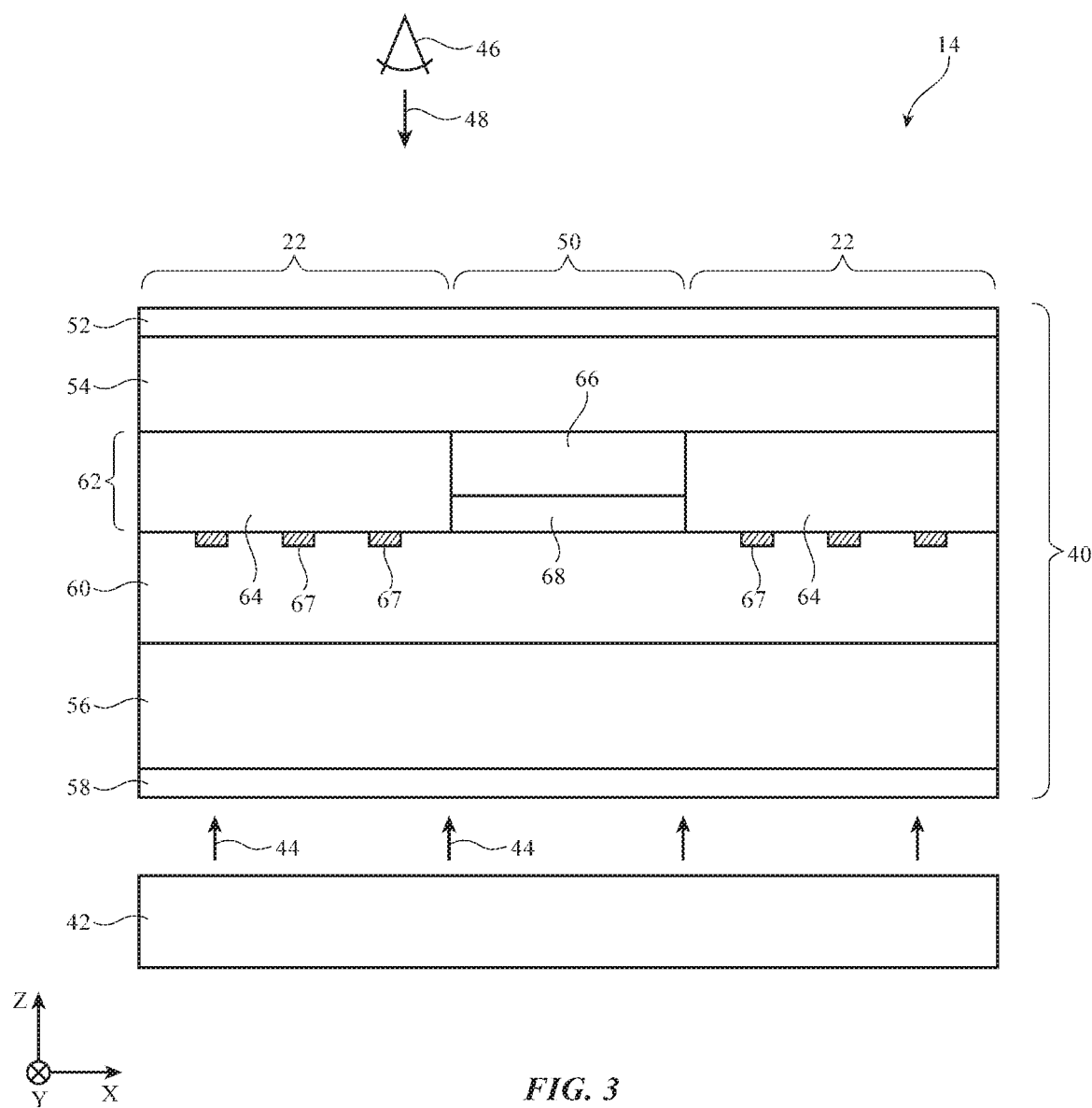
FIG. 3 is a cross-sectional side view of a display in accordance with an embodiment.

A cross-sectional side view of display 14 is shown in FIG. 3. As shown in FIG. 3, display 14 may have a backlight such as backlight unit 42 that generates backlight illumination 44 for backlighting display layers 40. Display layers 40 are configured to form an array of pixels 22. Display layers 40 include upper polarizer 52 and lower polarizer 58. Upper substrate layer 54 and lower substrate layer 56, which are interposed between upper polarizer 52 and lower polarizer 58, may be formed from transparent glass, transparent polymer, or other suitable transparent material. Liquid crystal layer 60 may be interposed between layers 54 and 56. Each pixel 22 may include a color filter 64. Color filters 64 may include, for example, red color filter elements for red pixels, green color filter elements for green pixels, and blue color filter elements for blue pixels. Pixel electrodes 67 may be formed from conductive finger structures on the inner surfaces of color filters 64 (e.g., chevron-shaped fingers).

Pixels 22 are separated from each other by a grid of opaque material (sometimes referred to as a black matrix). The black matrix has an array of openings that receive respective color filters 64. Portions of display 14 that overlap the black matrix (see, e.g., portion 50) do not transmit light 44 from backlight 42. Portions of display 14 with color filters 64 form pixels 22 that pass light 44 in accordance with their currently loaded data to a viewer such as viewer 46 who is viewing display 14 in direction 48. As shown in FIG. 3, a portion of black matrix 66 may be laterally interposed between each pair of adjacent color filters 64. Thin-film transistor circuitry 68 (e.g., a pixel circuit for one of pixels 22) may be formed on the inwardly facing (downwardly facing in the orientation of FIG. 3) surface of the black matrix layer.

In the arrangement of FIG. 3, layer 62 on the inwardly facing surface of upper (outwardly facing) substrate 54 includes black matrix 66, thin-film transistor circuitry 68, and color filters 62. Lower substrate 56, which is adjacent to the backlight structures of backlight unit 42, may be free of color filters 62, black matrix 66, and thin-film transistor circuitry 68.

Figure 4:
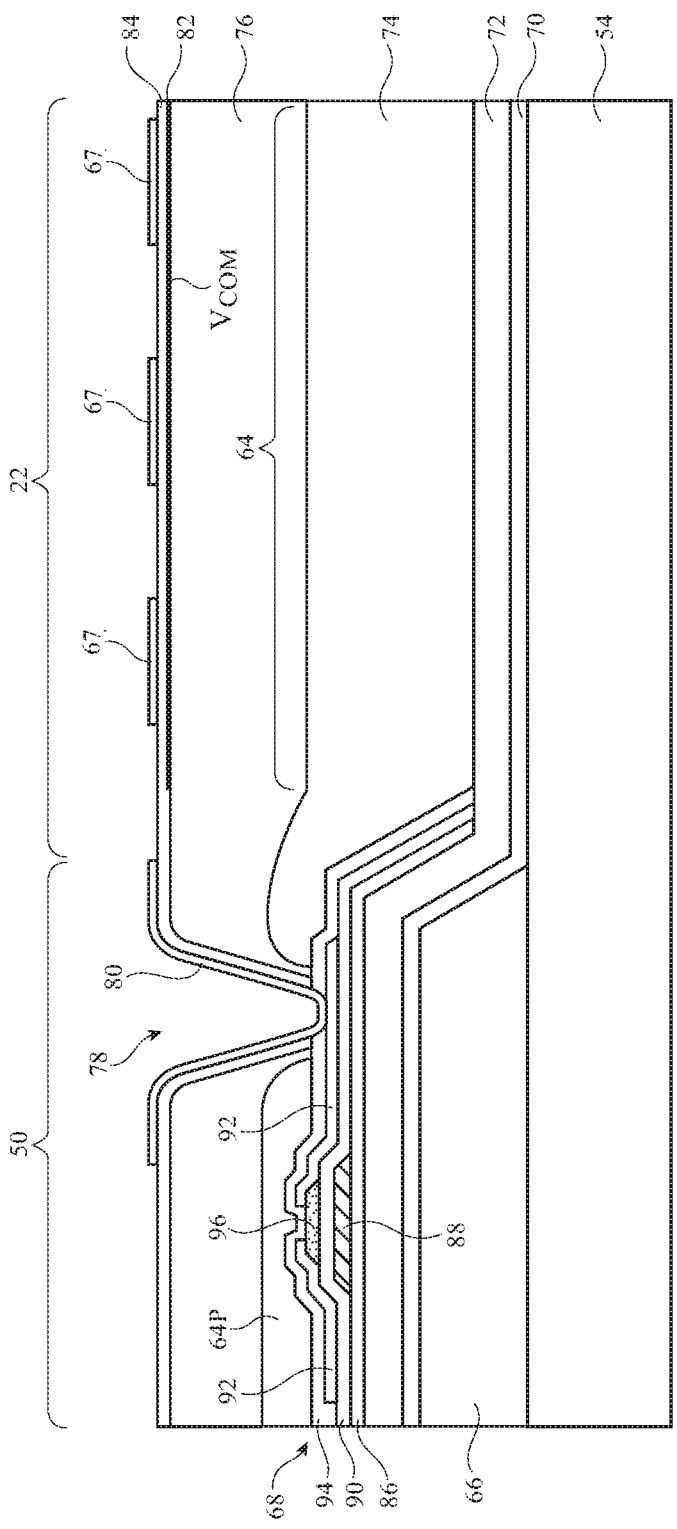
FIG. 4 is a cross-sectional side view of an illustrative upper substrate in a display in accordance with an embodiment.

A cross-sectional side view of the upper substrate of FIG. 3 (in an upside down configuration relative to that of FIG. 3) is shown in FIG. 4. A shown in FIG. 4, black matrix 66 may be formed on the inwardly facing surface of substrate 54. Dielectric layer 70 may cover black matrix 66 and the surface of substrate 54 in pixels 22 (e.g., layer 70 may be a blanket layer that overlaps all of the upper substrate). Layer 70 may be formed from a material such as silicon oxide or other inorganic dielectric. Dielectric layer 72 may be formed on layer 70. Dielectric layer 72 may be, for example, a layer of spin-on-glass (e.g., a layer of 0.3-0.8 microns in thickness, at least 0.5 microns in thickness, less than 2 microns in thickness, etc.). The presence of layer 72 may help reduce capacitive coupling between black matrix 66 and thin-film transistor circuitry 68.

Buffer layer 86 (e.g., an inorganic dielectric such as silicon oxide and/or silicon nitride) may be formed on layer 72. Transistor gate 88 may be formed from metal or other suitable conductive materials on layer 86. Gate insulator layer 90 (e.g., an inorganic dielectric such as silicon oxide) may be formed between gate 88 and semiconductor layer 96. Semiconductor layer 96 (e.g., a layer of polysilicon, a layer of semiconducting oxide such as InGaZnO, or other semiconductor for forming a transistor for thin-film transistor circuitry 68) may be formed on layer 90. Source-drain contacts 92 for the thin-film transistor of FIG. 4 may be formed from a patterned metal layer on gate insulator layer 90. Dielectric layer 94 (sometimes referred to as a passivation layer) may be formed from an inorganic dielectric (e.g., a layer of silicon nitride covering a layer of silicon oxide). A layer of colored polymer (e.g., colored photoimageable polymer) such as layer 74 may be patterned to form color filter elements on display 14 such as color filter element 64 for pixel 22. The thickness of the portion of colored polymer 74 that forms color filter element 64 may be 2.7 microns, at least 1.5 microns, less than 4 microns, or other suitable thickness. Some of layer 74 such as colored polymer portion 64P may overlap thin-film transistor circuitry 68 on black matrix 66, so that transistor circuitry 68 is interposed between portion 64P and black matrix 66. The thickness of portion 64P may be relatively small (e.g., 0.7-1.9 microns, 0.8-1.5 microns, at least 0.8 microns, less than 1.5 microns, 0.5-2 microns, etc.), which helps reduce the contact size associated with the via formed from portion 80 and thereby helps enhance pixel aperture ratio.

Dielectric layer 76 (e.g., a polymer) may serve as a planarization layer and may be a blanket film that overlaps all of layer 54. Common voltage electrode Vcom may be formed from a transparent conductive layer (e.g., a layer of indium tin oxide) such as layer 82. Electrodes 67 may be formed from a patterned layer of metal that is separated from common voltage electrode layer 82 by dielectric layer 84 (e.g., an inorganic dielectric such as silicon oxide). Electrodes 67 may be shorted to the transistor formed from gate 88 and source-train terminals 92 using portion 80 of the transparent conductive layer. Portion 80 may be shorted to one of source-drain terminals 92 through an opening such as via opening 78 in layers 84, 76, and 74. This forms a contact between the electrodes and the thin-film transistor.

Black matrix 66 may be a photoimageable polymer such as photoimageable polyimide. Black colorant may be incorporated into the polyimide to provide matrix 66 with a black appearance. The black colorant may be, for example, a black pigment such as titanium black pigment that exhibits satisfactory thermal stability to withstand thin-film processing temperatures. The thickness of black matrix 66 may be about 1-2.2 microns, at least 0.5 microns, less than 4 microns, or other suitable thickness. The optical density of black matrix 66 may be 2.7-6, at least 2.5, less than 7, or other suitable optical density.

During fabrication, layer 66 may be deposited and patterned. Layers 70 and 72 may then be deposited as blanket films. After forming thin-film transistor circuitry 68, thin-film layers associated with thin-film transistor circuitry 68 such as layer 86 and layer 90 may be selectively removed in pixels 22, while leaving layers 72 and 70 in place. Layers 74, 76, 82, 84, and the conductive layer forming electrodes 67 and portion 80 may then be deposited and patterned.

Figure 5:
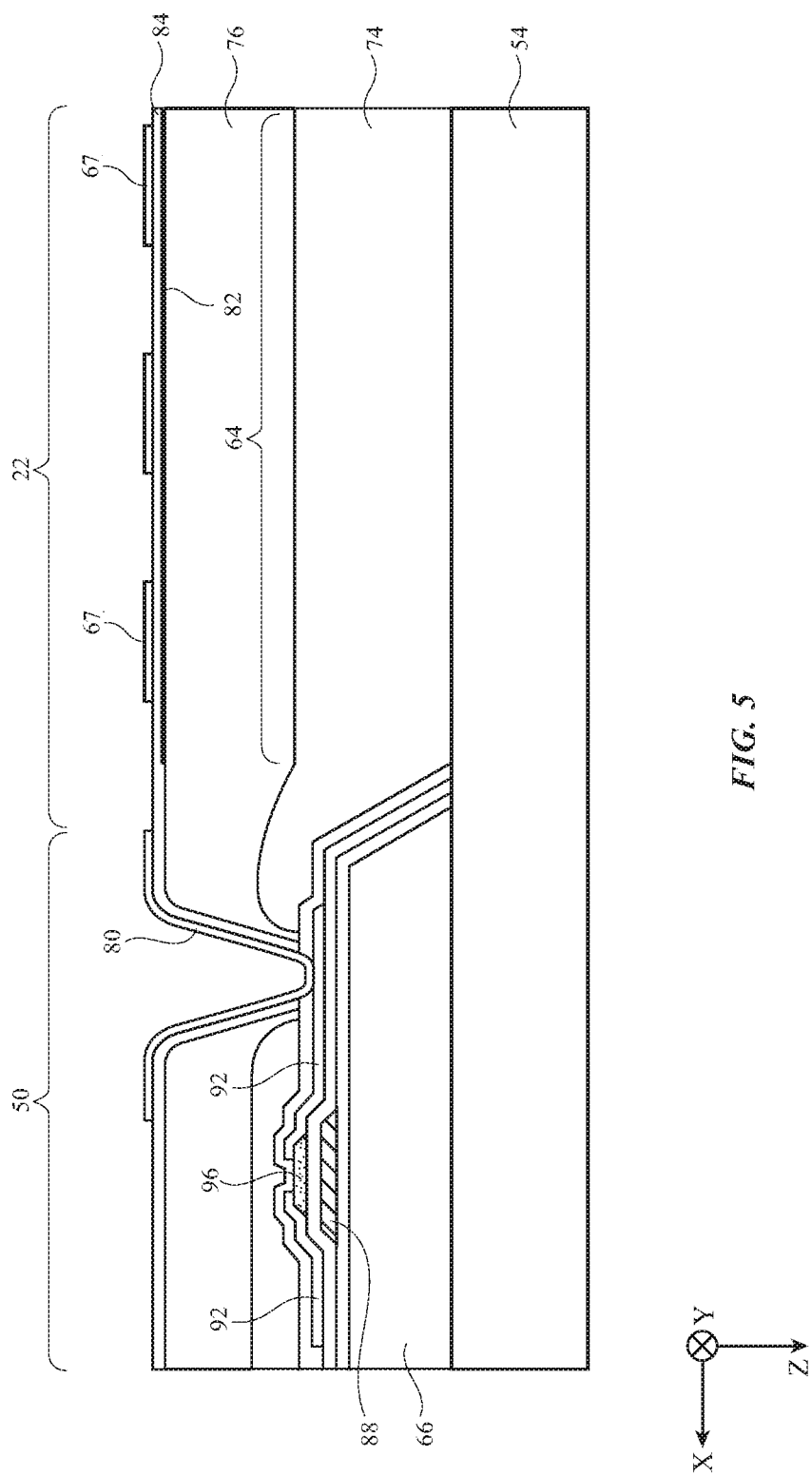
FIG. 5 is a cross-sectional side view of another illustrative upper substrate in a display in accordance with an embodiment.

In some configurations, the resistance of black matrix 66 may be sufficiently low to make capacitive loading of thin-film transistor circuitry 68 by black matrix 66 negligible. In this type of scenario, layer 72 may be omitted, as shown in FIG. 5.

Figure 6:
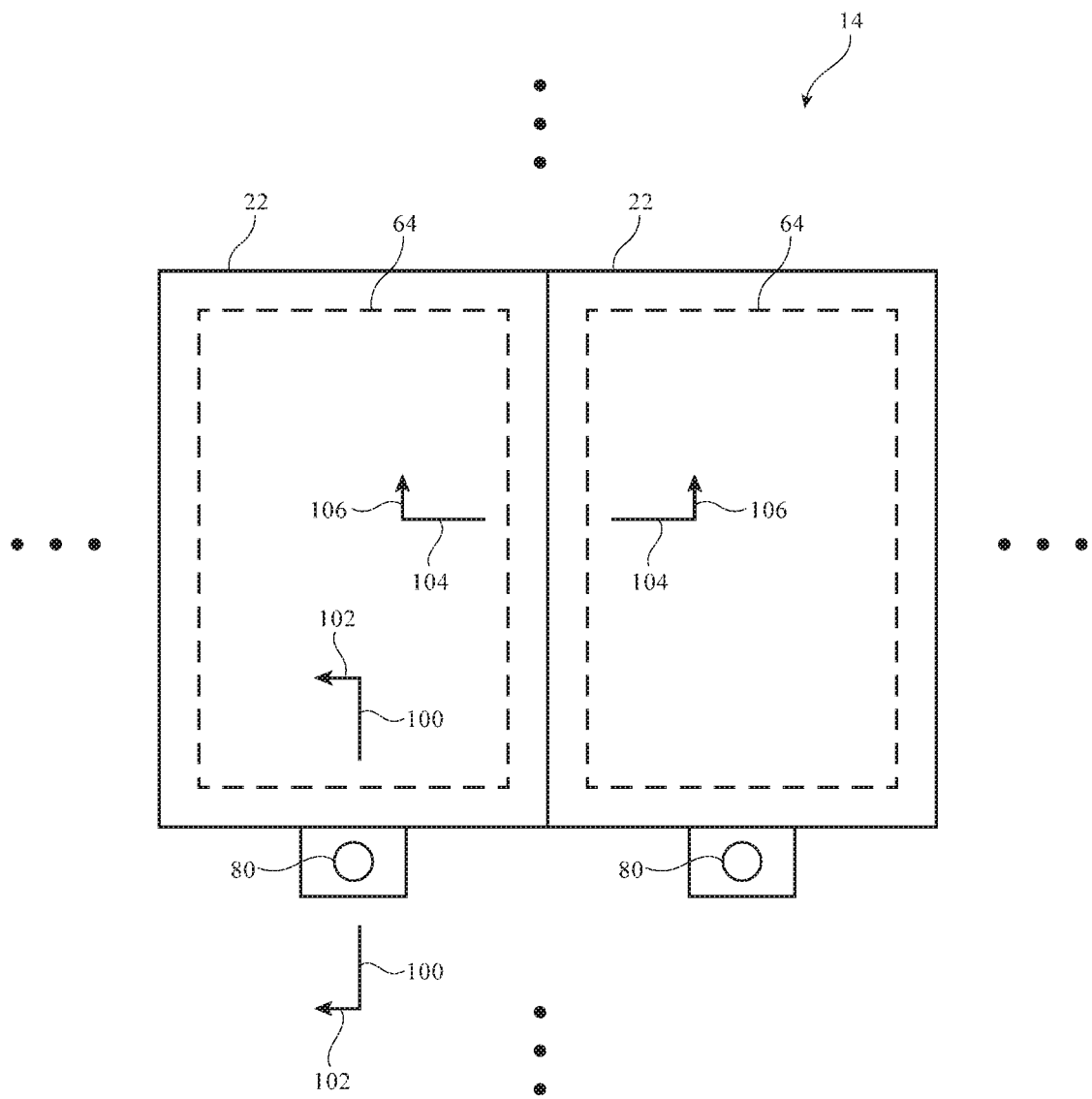
FIG. 6 is a top view of a pair of adjacent pixels in a display in accordance with an embodiment.

FIG. 6 is a top view of a pair of adjacent pixels 22 in display 14. The cross-sectional side views of FIGS. 4 and 5 correspond to cross-sections taken along line 100 and viewed in direction 102. A cross-sectional side view of pixels 22 taken along line 104 and viewed in direction 106 is shown in FIG. 7.

Figure 7:
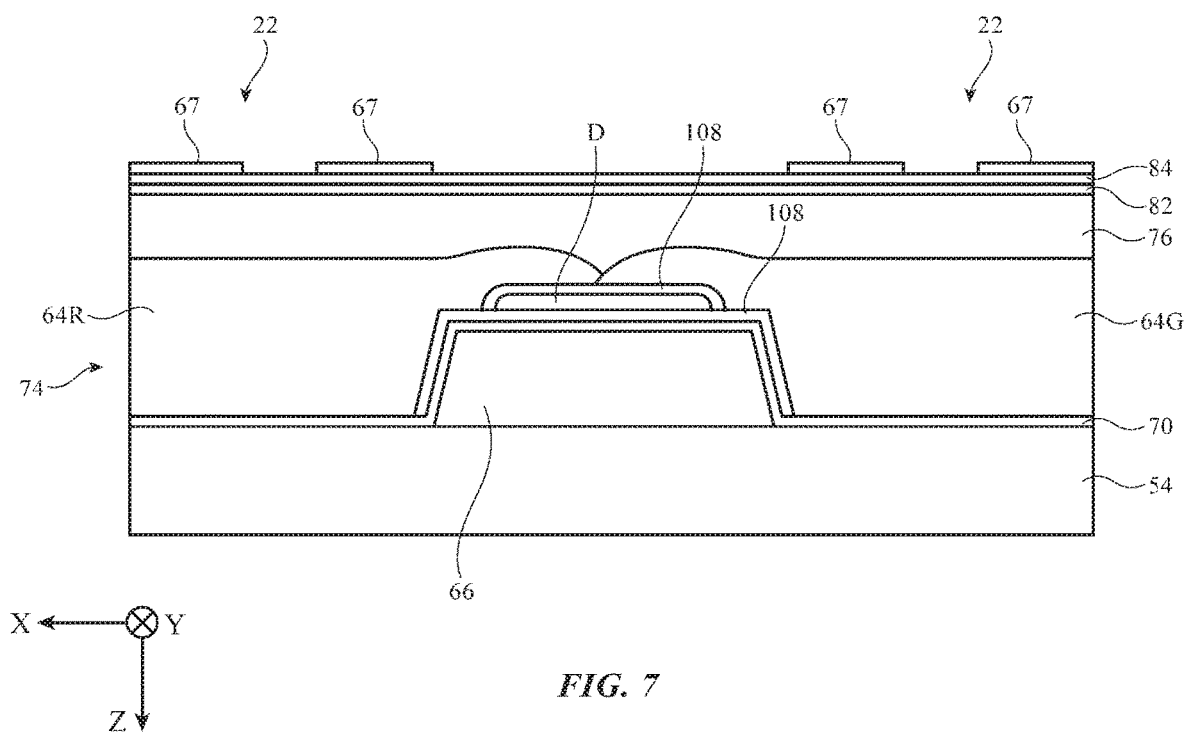
FIG. 7 is a cross-sectional side view of an illustrative upper substrate showing a pair of adjacent pixels in accordance with an embodiment.

The cross-sectional side view of FIG. 7 shows the border between two adjacent pixels of different colors (e.g., two pixels 22 having respective red and green color filters such as red color filter 64R and green color filter 64G). As shown in FIG. 7 data line D (e.g., a metal trace) and black matrix 66 may overlap (e.g., so that black matrix 66 hides data line D from view by a viewer of display 14). Dielectric layers such as layer 70 and layers 108 (see, e.g., layers such as layers 86, 90, and/or 94 of FIG. 4) may surround data line D to electrically isolate data line D. Data line D and the other structures of FIG. 7 may be patterned photolithographically, which enables tight tolerances to be used (e.g., compared to lower tolerances used when color filter and black matrix material are formed on a lower substrate while thin-film transistor circuitry is formed on an upper substrate).

As shown in FIG. 7, because black matrix 66 is covered by edge portions of color filters 64, the inner surface of these layers will be relatively flat (e.g., no black matrix will protrude above layer 76. As a result, the alignment of liquid crystals near the border between pixels of different colors will not be perturbed by the shape of black matrix 66. This lack of disruption to the alignment of the liquid crystals will reduce light leakage in display 14.

Figure 8:
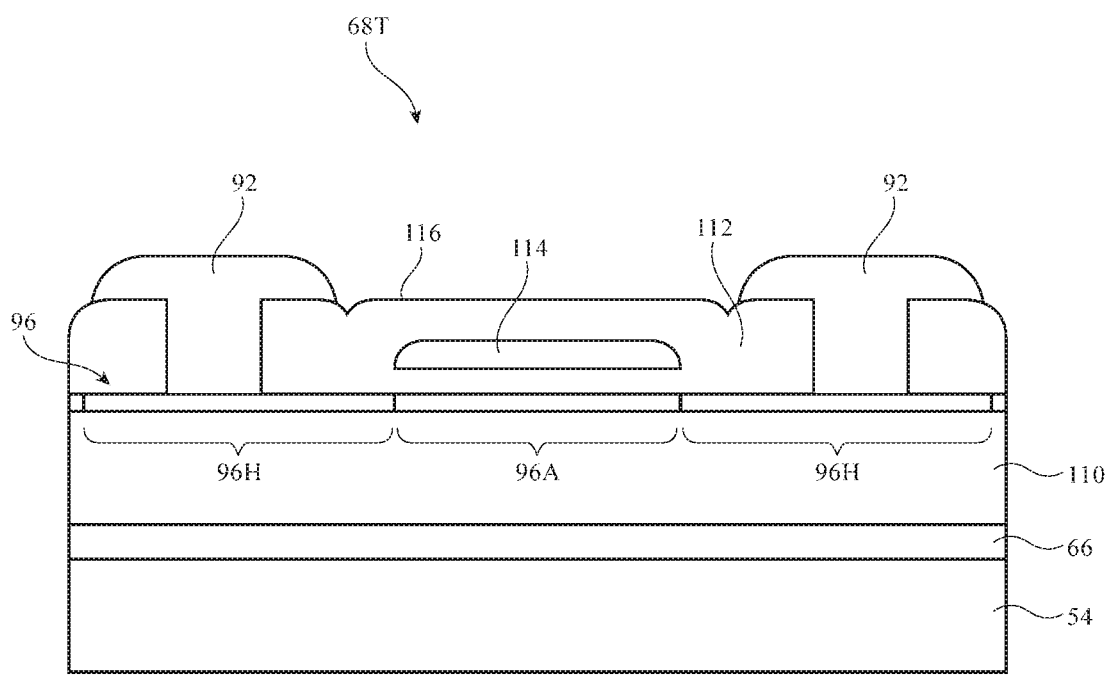
FIG. 8 is a cross-sectional side view of an illustrative thin-film transistor of the type that may be used in a display in accordance with an embodiment.
Figure 8:
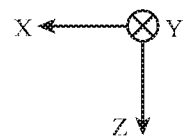

The illustrative thin-film transistor of FIG. 4 uses a bottom gate configuration in which gate 88 is interposed between semiconductor layer 96 and substrate 54. If desired, a top gate configuration may be used. This type of arrangement is shown in FIG. 8. As shown in FIG. 8, transistor 68T for thin-film transistor circuitry 68 may have a gate such as gate 114. Semiconductor layer 96 may be interposed between gate 114 and black matrix 66. Black matrix 66 may be formed on substrate 54. Dielectric buffer layer 110 may be interposed between black matrix 66 and semiconductor layer 96. Semiconductor layer 96 may include heavily doped regions 96H that form contacts with source-drain terminals 92 and a lightly doped active area (channel region) 96A. Dielectric 112 (e.g., gate insulator) may be interposed between gate 114 and active area 96A. During operation in display 14, upper surface 116 faces backlight unit 42. Top gate 114 therefore serves as a light shield and blocks backlight illumination 44 so that active area 96A is not illuminated. Because gate 114 serves as a light shield, transistor 68T does not need a backside metal light shield. This may help minimize capacitive loading on transistor 68T.

Figure 9:
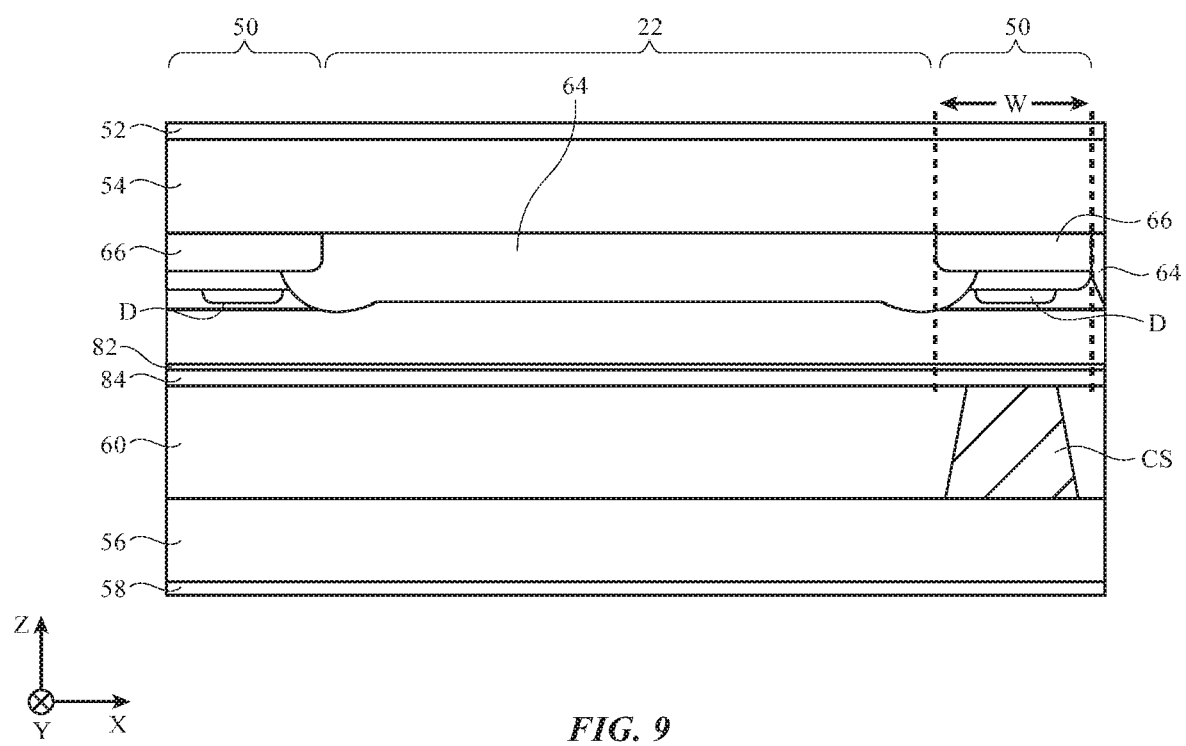
FIG. 9 is a cross-sectional side view of a portion of a display in accordance with an embodiment.

FIG. 9 is a cross-sectional side view of a portion of display 14 showing how column spacers such as column spacer CS may be formed on substrate 56 to help maintain a desired separation for liquid crystal layer 60 between the upper and lower substrate layers of display 14. Column spacer CS may be overlapped by black matrix 66. Because there is no black matrix on lower substrate 56, black matrix 66 may be aligned photolithographically with the structures on substrate 54, thereby helping to reduce misalignment and minimizing the size of black matrix width W (e.g., to 5-6 microns, less than 6 microns, less than 5 microns, at least 2 microns, or other suitable width).

The foregoing is merely illustrative and various modifications can be made to the described embodiments. The foregoing embodiments may be implemented individually or in any combination.

What is claimed is:

1. A display, comprising:
   first and second substrates;
   a liquid crystal layer between the first and second substrates;
   pixels formed from thin-film transistor circuitry on the first substrate;
   a black matrix layer on the first substrate that has openings for the pixels;
   color filter elements in the openings directly on the first substrate, wherein the color filter elements are formed from colored polymer, and wherein a portion of the colored polymer overlaps the thin-film transistor circuitry and wherein the thin-film transistor circuitry is interposed between the portion of the colored polymer and the black matrix layer on the first substrate, wherein the black matrix layer completely covers the thin-film transistor circuitry; and
   a dielectric layer interposed between the black matrix layer and the thin-film transistor circuitry.

2. The display defined in claim 1 further comprising upper and lower polarizers, wherein the first and second substrates are interposed between the upper and lower polarizers.

3. The display defined in claim 2 further comprising a backlight adjacent to the lower polarizer that is configured to provide backlight illumination for the pixels.

4. The display defined in claim 3, wherein the thin-film transistor circuitry includes a bottom gate thin-film transistor having a gate and having a semiconductor layer interposed between the gate and the portion of the colored polymer.

5. The display defined in claim 3, wherein the thin-film transistor circuitry includes a top gate thin-film transistor having a gate and having a semiconductor layer interposed between the gate and the black matrix layer.

6. The display defined in claim 3 further comprising a spin-on-glass layer interposed between the thin-film transistor circuitry and the black matrix layer.

7. The display defined in claim 3, wherein there is no spin-on-glass layer interposed between the thin-film transistor circuitry and the black matrix layer.

8. The display defined in claim 1, wherein the black matrix layer comprises polyimide with titanium black pigment.

9. The display defined in claim 1 further comprising a data line that is overlapped by the black matrix layer, wherein the liquid crystal layer is interposed between the data line and the second substrate.

10. The display defined in claim 9 further comprising an upper polarizer, wherein the first substrate comprises an upper substrate, wherein the second substrate comprises a lower substrate, wherein the upper substrate is interposed between the upper polarizer and the lower substrate, and wherein the first and second substrates comprise glass substrates.

11. The display defined in claim 1, wherein the thin-film transistor circuitry includes thin-film transistors having source-drain terminals, gate terminals, and indium gallium zinc oxide semiconductor layers.

12. The display defined in claim 1, wherein the portion of the colored polymer has an opening and wherein a conductive layer passes through the opening and contacts a source-drain terminal in a thin-film transistor in the thin-film transistor circuitry.

13. The display defined in claim 12 further comprising a planarization layer that overlaps the patterned colored polymer, wherein the opening in the patterned color polymer layer is associated with a via formed from the conductive layer, wherein the via passes through the colored polymer and the planarization layer.

14. The display defined in claim 1, wherein the portion of the colored polymer that overlaps that thin-film transistor circuitry has a thickness of 0.5-2 microns.

15. The display defined in claim 1, wherein the black matrix layer includes a portion that is overlapped by a data line and wherein edge portions of the color filter elements overlap over the data line.

16. The display defined in claim 15 further comprising:
a common voltage electrode layer; and
a planarization layer that overlaps the color filter elements, the edge portions of the color filter elements, the data line, and the black matrix layer, wherein the planarization layer is interposed between the common voltage electrode layer and the color filter elements.

17. A display, comprising:
an upper substrate;
a lower substrate;
a liquid crystal layer between the upper and lower substrates;
pixels formed from thin-film transistor circuitry on the upper substrate;
a black matrix on the upper substrate that has openings for the pixels, wherein the black matrix overlaps the thin-film circuitry and is separated from the thin-film circuitry by at least one dielectric layer;
colored polymer on the upper substrate having first portions that overlap the black matrix and second portions that fill the openings to form color filter elements for the pixels, wherein the colored polymer has openings between the first portions and the second portions;
conductive structures that fill vias in the openings between the first portions and the second portions, wherein some of the first portions and the second portions of the colored polymer is interposed between the conductive structures and the black matrix, wherein the black matrix completely covers the conductive structures; and
data lines that are interposed between the first portions and the black matrix.

18. The display defined in claim 17, wherein the thin-film transistor circuitry includes a thin-film transistor having a gate and having a semiconductor layer interposed between the gate and the black matrix, the display further comprising:
a backlight, wherein the lower substrate is between the upper substrate and the backlight.

19. A display, comprising:
an upper substrate;
a lower substrate;
a liquid crystal layer between the upper and lower substrates;
pixels formed from thin-film transistor circuitry on the upper substrate, wherein the thin-film circuitry is disposed on a plurality of interspersed dielectric layers;
a black matrix on the upper substrate that has openings for the pixels, wherein the black matrix completely covers the thin-film circuitry, and the plurality of interspersed dielectric layers is interposed between the black matrix and the thin-film circuitry; and
colored polymer on the substrate having first portions that overlap the black matrix and that overlap the interspersed dielectric layers, and second portions that fill the openings to form color filter elements for the pixels and that do not overlap the interspersed dielectric layers, wherein the thin-film transistor circuitry is interposed between the first portions and the black matrix.

20. The display defined in claim 19, wherein the thin-film transistor circuitry includes a thin-film transistor having a gate and having a semiconductor layer interposed between the gate and the black matrix, the display further comprising:
a backlight, wherein the lower substrate is between the upper substrate and the backlight.

* * * * *